United States Patent
Tsunoda et al.

(10) Patent No.: US 8,372,239 B2
(45) Date of Patent: Feb. 12, 2013

(54) PLASMA PROCESSING APPARATUS

(75) Inventors: Takanori Tsunoda, Kyoto (JP); Yoshio Matsubara, Kyoto (JP); Yasunori Ando, Kyoto (JP); Masayuki Tsuji, Kyoto (JP)

(73) Assignee: Nissin Electric Co., Ltd., Kyoto (JP)

( * ) Notice: Subject to any disclaimer, the term of this patent is extended or adjusted under 35 U.S.C. 154(b) by 0 days.

(21) Appl. No.: 13/449,304

(22) Filed: Apr. 17, 2012

(65) Prior Publication Data

US 2012/0325404 A1    Dec. 27, 2012

(30) Foreign Application Priority Data

Jun. 24, 2011   (JP) .................. 2011-140128

(51) Int. Cl.
*C23C 16/00*   (2006.01)
*H01L 21/306*   (2006.01)
(52) U.S. Cl. ............ 156/345.48; 118/723 I; 118/723 AN
(58) Field of Classification Search ................ 118/723 I, 118/723 IR, 723 AN; 156/345.48, 345.49; 315/111.51
See application file for complete search history.

(56) References Cited

U.S. PATENT DOCUMENTS 6,323,595 B1 * 11/2001 Tonotani et al. ......... 315/111.51

FOREIGN PATENT DOCUMENTS

| JP | H08-037097 | 2/1996 |
| JP | H11-317299 | 11/1999 |
| JP | 2010-225296 | 10/2010 |
| WO | 2009142016 | 11/2009 |

* cited by examiner

*Primary Examiner* — Luz L. Alejandro
(74) *Attorney, Agent, or Firm* — Jianq Chyun IP Office

(57) ABSTRACT

An inductively-coupled-plasma (ICP) type plasma processing apparatus is provided. The plasma processing includes an antenna which is substantially straight in a plan view of the antenna. A plasma is generated for performing a plasma treatment to a substrate when a high frequency current is applied to the antenna to form an electric field in a vacuum container. The antenna includes two go-and-return conductors closely disposed to each other in an up-down direction, wherein the up-down direction is perpendicular to a surface of the substrate, and the high frequency current is applied to flow in opposite directions between the two go-and-return conductors. An interval is defined by a distance between the two go-and-return conductors in the up-down direction, varies in a longitudinal direction of the antenna.

4 Claims, 13 Drawing Sheets

PLASMA PROCESSING APPARATUS

CROSS-REFERENCE TO RELATED APPLICATION

This application claims the priority benefit of Japan application serial no. 2011-140128, filed on Jun. 24, 2011. The entirety of the above-mentioned patent application is hereby incorporated by reference herein and made a part of this specification.

BACKGROUND OF THE INVENTION

1. Field of the Application

The present invention relates to a plasma processing apparatus, and more particularly, to an inductively-coupled-plasma (ICP) type plasma processing apparatus.

2. Description of Related Art

Plasma processing apparatuses using high frequency (HF) to generate plasma can be classified into capacitively-coupled-plasma (CCP) type plasma processing apparatuses capable of generating capacitively-coupled plasma and inductively-coupled-plasma type (ICP) plasma processing apparatuses capable of generating inductively-coupled plasma.

It can simply say that a radiofrequency voltage is applied to two parallel electrodes and a high frequency electric field generated between the two electrodes is used to generate plasma in CCP type plasma processing apparatuses.

In the CCP type plasma processing apparatuses, there are problems causing the plasma potential to become higher due to a high voltage applied to the plasma. Since charged particles (e.g., ions) of the plasma impinge on the substrate with a high energy, the damage induced to the film which is formed on the substrate may increase and deteriorate the film quality.

On the other hand, in ICP type plasma processing apparatuses, an induction electric field generated by applying a radiofrequency current to flow to an antenna is used to generate plasma. Basically, compared with the CCP plasma processing apparatuses, the ICP plasma processing apparatuses have the advantage of being capable to lower the plasma potential.

Taking the ICP plasma processing apparatus as an example, in International Publication No. WO 2009/142016 (paragraphs [0024] to [0026], FIG. 1), a flat-board-like antenna is mounted on an opening of a vacuum container through an insulating frame. A high frequency power supply is supplied to the flat-board-like antenna so that a high frequency current can flow from one end to the other end of the antenna, and thereby plasma is generated due to the induced electric field. It has been described in WO 2009/142016 that the plasma is used to perform a plasma treatment to the substrate in the plasma processing apparatus.

SUMMARY OF THE INVENTION

In ICP type plasma processing apparatus, the antenna has to be long and the impedance (particularly inductance) of the antenna increases for a large substrate; thus, a large potential difference between the two terminals of the antenna would be induced.

Since the antenna potential is influenced by the plasma potential via the capacitance of the plasma, the antenna potential is increased with an increase of the plasma potential. As a result, challenges arise that the damage induced on the film which is formed on the substrate is increased and the film quality is decreased due to the charged particles (e.g., ions) of the plasma impinging on the substrate with a high energy.

Accordingly, one exemplary embodiment of the present invention is to provide an (inductively-coupled plasma) ICP type plasma processing apparatus capable of decreasing the effective inductance of the antenna and suppressing the plasma potential, and moreover the plasma density distribution in the longitudinal direction of the antenna can further be controlled.

The plasma processing apparatus of the present invention is an ICP type. A high frequency current is applied to an antenna that is substantially straight in a plan view of the antenna so that an electric field is induced in a vacuum container to generate plasma for performing a plasma treatment to a substrate. In the plasma processing apparatus, the antenna is constructed by two go-and-return conductors closely disposed to each other in a perpendicular line direction, which stands on a surface of the substrate, i.e., the direction is perpendicular to the surface of the substrate. The high frequency current can flow in opposite directions between the go-and-return inductors. Moreover, the interval formed in the direction between the two go-and-return conductors can be changed in the longitudinal direction of the antenna, i.e., the interval between the two go-and-return conductors is different in the longitudinal direction of the antenna.

In order to simplify the illustration, the perpendicular line direction that stands on the surface of the substrate is called an up-down direction and the direction intersecting the perpendicular line is called a left-right direction in this specification. Accordingly, the up-down direction is not necessarily the vertical direction.

Since the two go-and-return conductors of the antenna are closely disposed to each other in the up-down direction and the high frequency current can flow in opposite directions between the conductors, the effective inductance of the antenna is decreased due to the mutual inductance between the two go-and-return conductors. Accordingly, antenna potential can be decreased and thus the plasma potential can be decreased.

In addition, since the mutual inductance between the two go-and-return conductors can be varied in the longitudinal direction of the antenna by varying the interval in the up-down direction of the two go-and-return conductors to be different in the longitudinal direction of the antenna, the electromagnetic energy supplied for plasma from the antenna can be varied in the longitudinal direction of the antenna. Hence, the plasma density distributed along the longitudinal direction can be controlled by the antenna.

The intervals in the up-down direction between the two go-and-return conductors at the two terminals located in the longitudinal direction of the antenna may also be disposed to be larger than the interval at the central portion.

According to one embodiment of the present invention, the antenna includes two go-and-return conductors closely disposed to each other in the up-down direction of the antenna and a high frequency current is applied to flow in opposite directions between the two go-and-return conductors. The effective inductance of the antenna is reduced due to the mutual inductance between the go-and-return conductors. Accordingly, the potential of the antenna can be suppressed to be small and then the plasma potential can be suppressed to be small. As a result, the energy of the charged particles impinging to the substrate from the plasma can be reduced. For example, the damage induced to the film formed on the substrate can be reduced, and the film quality can also be improved. Moreover, since the potential of the antenna and the plasma potential can be suppressed to be small, the dimension of the substrate to be treated can also be correspondingly increased according to the increase of the length of the antenna.

Moreover, the mutual inductance between the go-and-return conductors can be altered in the longitudinal direction of the antenna by rendering the interval of the go-and-return conductors in the up-down direction being altered in the longitudinal direction of the antenna. Thus, the electromagnetic energy supplied for plasma from the antenna can be varied in the longitudinal direction of the antenna. Accordingly, through the antenna, the plasma density distributed along the longitudinal direction can be controlled. As a result, the processing status of the substrate in the longitudinal direction of the antenna can also be controlled. For example, the film thickness distributed along the longitudinal direction of the antenna can also be controlled.

In addition, since the antenna includes two go-and-return conductors closely disposed to each other in the up-down direction and a high frequency current is applied to the go-and-return conductors to flow in opposite directions, the interval between the go-and-return conductors in the up-down direction can be varied along the longitudinal direction of the antenna. Compared to the antenna constructed by the go-and-return conductors closely disposed to each other in the left-right direction and the interval of the go-and-return conductors in the left-right direction is variable, the magnetic flux density near the bottom of the antenna can be well controlled by varying the interval between the go-and-return conductors. Accordingly, by varying the interval between the go-and-return conductors, the electromagnetic energy supplied for plasma from the antenna can be well controlled, and consequently the plasma density distribution can also be well controlled.

According to another embodiment of the present invention, another efficacy of the present invention is described as follows. Regarding the plasma density distributed in the longitudinal direction of the antenna, the plasma density distributed at the two terminals is generally smaller than the plasma density distributed at the central portion, i.e., a mountain-shaped distribution. Consequently, according to the embodiment of the present invention, the intervals between the go-and-return conductors in the up-down direction located at the two terminals are designed to be larger than the interval at the central portion in the longitudinal direction of the antenna. Thus, the mutual inductances at the two terminals in the longitudinal direction of the antenna are smaller than the mutual inductance at the central portion. Therefore, the effective inductances at the two terminals relatively become larger than the effective inductance at the central portion of the antenna. As a result, the electromagnetic energy supplied for plasma from the antenna at the two terminals in the longitudinal direction of the antenna can be relatively larger than the electromagnetic energy at the central portion, opposite to the mountain-shaped distribution. Thus, the mountain-shaped plasma density distribution can be compensated, and the homogeneity of the plasma density distributed along the longitudinal direction of the antenna can be enhanced. As a result, the uniformity of the processing status of the substrate in the longitudinal direction of the antenna can also be improved. For example, the uniformity of the film thickness distributed along the longitudinal direction of the antenna can be enhanced.

According to another embodiment of the present invention, another efficacy of the present invention is further described as follows. Since a plurality of antennas are disposed in parallel and a high frequency power is supplied to each of the antennas in parallel, plasma with a large area can be generated. Moreover, not only the potential of each of the antennas can be suppressed to be small, but also the plasma density distributed along the longitudinal direction of each of the antennas can be controlled. In addition, the balance of the high frequency current to flow to the antennas can be adjusted through the variable impedances respectively connected to the antennas. Therefore, the plasma density distributed in the parallel direction of the antennas can be controlled. As a result, the plasma potential can be suppressed to be small and generating plasma with good homogeneity and a large area is possible.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
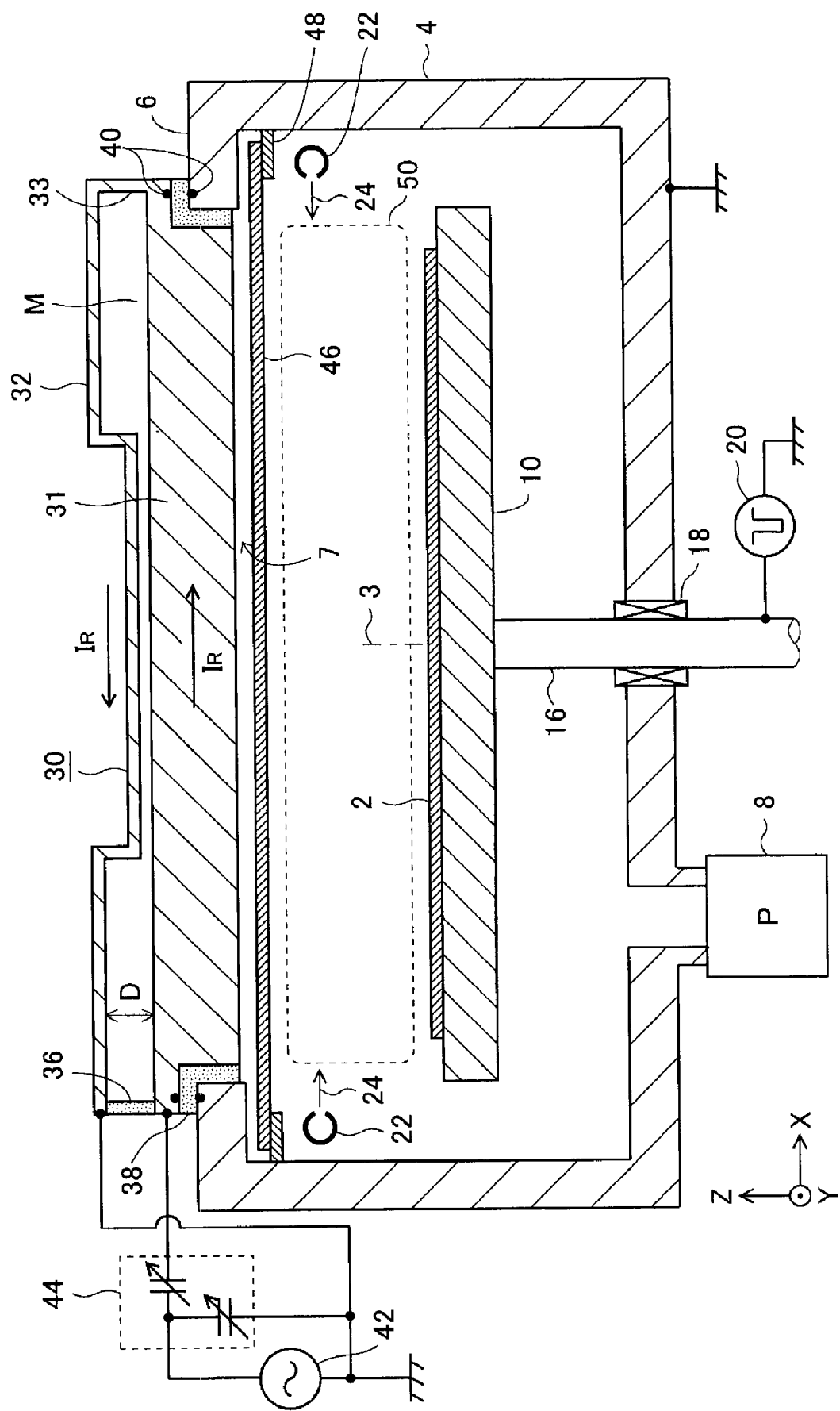
FIG. 1 is a cross-sectional view of a plasma processing apparatus according to an embodiment of the present invention.
Figure 2A:
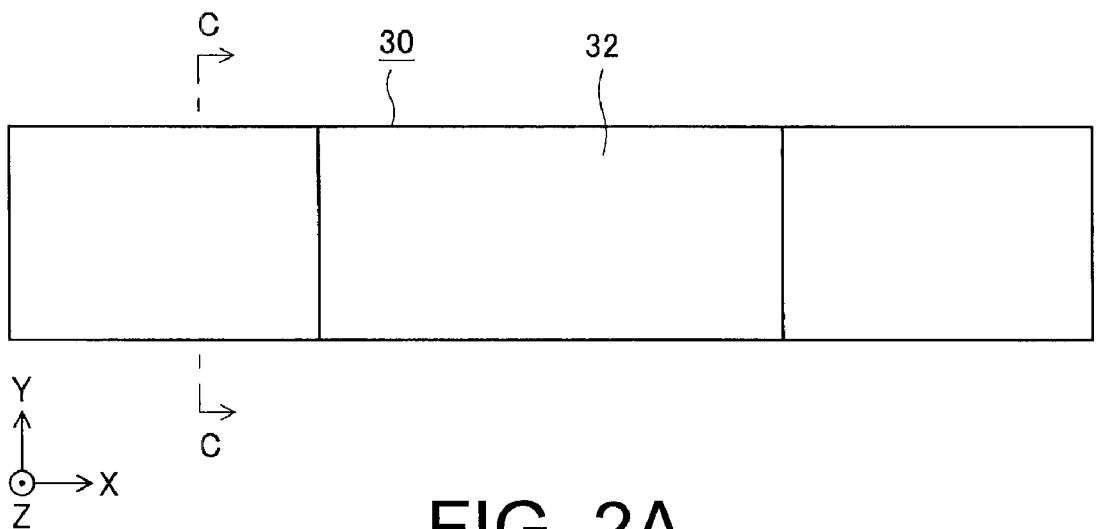
FIG. 2A is a plan view of the antenna of FIG. 1.
Figure 2B:
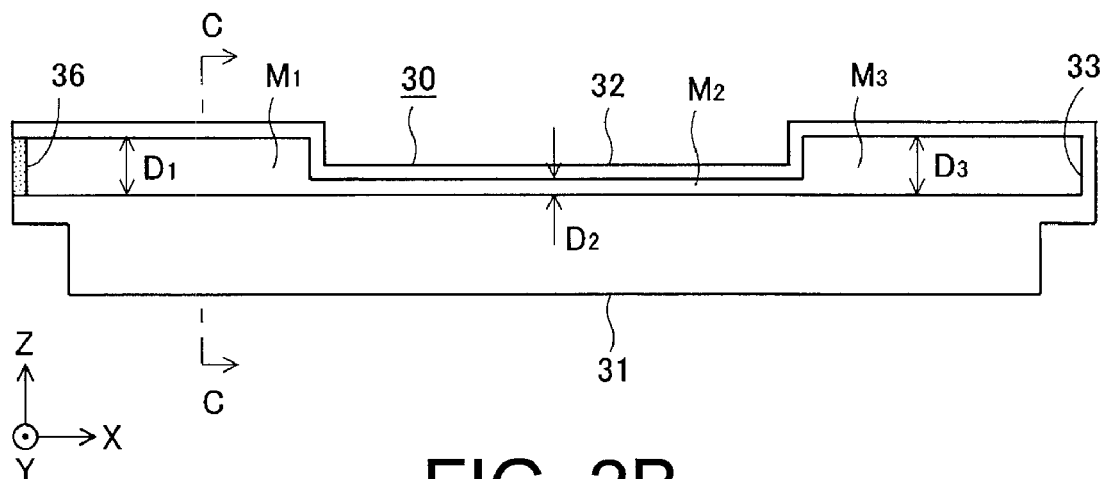
FIG. 2B is a side view of the antenna of FIG. 1.

A plasma processing apparatus according to an embodiment of the present invention is shown in FIG. 1, and FIG. 2 shows the antenna of FIG. 1. In order to describe the directions of the antenna 30, the X direction, Y direction and Z direction, as shown in the figure, are orthogonal to each other. The Z direction is the direction of the perpendicular line 3 standing on a surface of the substrate 2. The Y direction is the direction intersecting (e.g., orthogonal to) the perpendicular line 3. These directions are respectively known as the up-down direction Z and the left-right direction Y to simplify the descriptions. The X direction is the direction intersecting (e.g., orthogonal to) the perpendicular line 3 and is the longitudinal direction of the antenna 30. For example, the X direction and Y direction are horizontal, but it is not limited thereto. The foregoing descriptions of the X direction, Y direction and Z direction are applicable in other figures.

The apparatus is an inductively-coupled plasma (ICP) type plasma processing apparatus. A high frequency current $I_R$ from a high frequency power source 42 is applied to an antenna 30, that is substantially straight in a plan view of the antenna, in the apparatus so that an electric field is induced in a vacuum container 4 to generate a plasma 50, and the plasma 50 is used to perform a plasma treatment to a substrate 2.

The term "substantially straight" not only represents "a straight status" according to the plan meaning of the words, but also represents "a nearly straight status".

The substrate 2 can be substrates used in flat panel displays (FPD) such as liquid crystal displays and organic electroluminescent displays, flexible substrates used in flexible displays, substrates used in solar cells of semiconductor display or the like; the present invention is not limited thereto.

The planar shape of the substrate 2 can be circular or quadrilateral, but the planar shape is not restricted in the present invention.

The treatment process to the substrate 2, for example, is forming a film by means of plasma CVD (chemical vapour deposition) process, etching, ashing, sputtering and the like.

The plasma processing apparatus is respectively called, a plasma CVD apparatus if it is used for the plasma CVD process, a plasma etching apparatus for etching process, a plasma ashing apparatus for ashing process, and a plasma sputtering apparatus for sputtering process.

The plasma processing apparatus has a vacuum container 4 made of metal and the interior of the vacuum container 4 is vacuumed by using a vacuum exhaust device 8.

A gas 24 is brought into the vacuum container 4 through an inlet pipe 22. The gas 24 may be any gas which is appropriate to the processing content of the substrate 2. For example, if the substrate 2 is to form a film thereon by using the plasma CVD process, the gas 24 is a source gas and a diluted source gas (e.g., $H_2$). More specifically, the source gas 24 is $SiH_4$ for a Si film, $Sin_4+NH_3$ for a SiN film, $SiH_4+O_2$ for a $SiO_2$ film formed on the substrate 2, respectively.

A holder 10 is disposed in the vacuum container 4 to support the substrate 2. In the embodiment, the holder 10 is supported by a shaft 16. The shaft 16 has a bearing portion 18 disposed at where the shaft 16 passes through the vacuum container 4, and the bearing portion 18 has the functions of electrical insulation and vacuum sealing. According to the embodiment, a bias power supply 20 can be provided for applying a negative bias voltage to the holder 10 via the shaft 16. The bias voltage can be a negative pulse voltage. The bias voltage not only can control the impinging energy generated when the positive ions of the plasma 50 impinge the substrate 2, but also can control the crystallinity of the film when the film is formed on the surface of the substrate 2.

An antenna 30 is disposed at an opening 7 of the ceiling 6 of the vacuum container 4, and an insulating frame 38 is interposed between the antenna 30 and the opening 7. Packings 40 are respectively disposed for vacuum sealing between those components. The antenna 30 is disposed by using the two go-and-return conductors 31, 32 closely disposed to each other in the up-down direction Z. The antenna 30 (more particularly the two go-and-return conductors 31, 32 by which the antenna 30 is formed) has a surface with a planar shape. More specifically, the planar shape is a rectangular shape in this embodiment, but it is not limited thereto. The antenna 30 is described in detailed in the following.

The material of the antenna 30 is copper (more particularly oxygen-free copper OFC), aluminum and the like, for example, but it is not restricted thereto.

A high frequency power is applied to the antenna 30, more particularly to the go-and-return conductors 31 and 32, from a high frequency power source 42 through a matching circuit 44 so that a high frequency current $I_R$ flows to the antenna 30. Namely, the high frequency current (go-and-return current) $I_R$ flows in opposite directions between the two go-and-return conductors 31 and 32 by which the antenna 30 is formed (since it is a high frequency, the direction of the high frequency current $I_R$ reverses according to the time, and it is similar in the following). A high frequency magnetic field is generated due to the high frequency current $I_R$, and a high frequency current $I_R$ and an electric field to the opposite direction are induced due to the high frequency magnetic field. Due to the electric field, within the vacuum container 4, electrons are accelerated, the gas 24 near the antenna 30 is ionized and plasma 50 is formed near the antenna 30. The plasma 50 is diffused into the surrounding of the substrate 2, and the substrate 2 is treated by using the plasma 50.

The frequency of the high frequency power output from the high frequency power source 42 is 13.56 MHz in general, but the present invention is not limited thereto.

Figure 5:
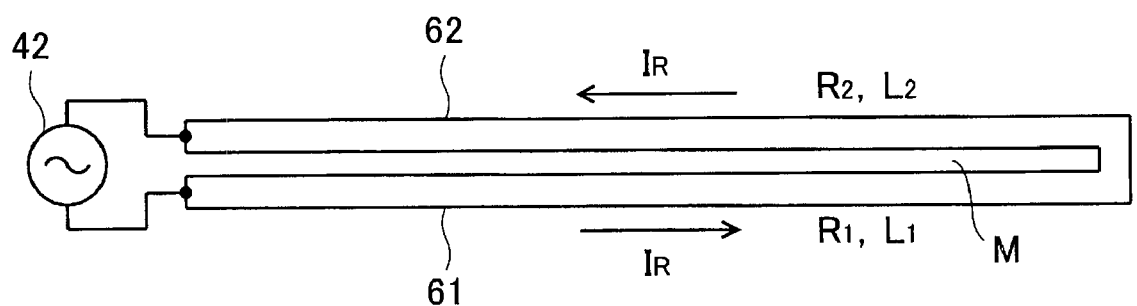
FIG. 5 is for illustrating the impedance of the two go-and-return conductors which are closely disposed to each other.

The detail of the antenna 30 is described in the following. As shown in FIG. 5, the total impedance $Z_T$ of the two go-and-return conductors 61 and 62 which are closely disposed in parallel, described in books, such as theory of electricity as a differential connection, can be represented by the following equation. Herein, $R_1$, $L_1$ are resistance and self-inductance of one of the conductors 61, respectively, while $R_2$, $L_2$ are resistance and self-inductance of the other conductor 62, respectively, and M is mutual inductance of the two conductors 61 and 62.

$$Z_T = (R_1 + R_2) + j(L_1 + L_2 - 2M) \quad (1)$$

Herein, in order to simplify the descriptions, it is assumed that $R_1 = R_2 = R$, $L_1 = L_2 = L$, the total impedance $Z_T$ is represented in Equation 2, and their inductance $L_T$ is represented in Equation 3. Regarding the inductance $L_T$, the combination of the self inductance and the mutual inductance is defined as an effective inductance in this specification.

$$Z_T = 2R + j2(L-M) \quad (2)$$

$$L_T = 2(L-M) \quad (3)$$

It can be noted from the above equations that the total impedance $Z_T$ and the effective inductance $L_T$ are decreased as the mutual inductance M between the two go-and-return conductors 61 and 62 is increased. The electromagnetic energy G generated by using the flow of high frequency current $I_R$ from the high frequency power source 42 to the two go-and-return conductors 61 and 62 is represented in the following equation, wherein the electromagnetic energy G is decreased with an increase of the mutual inductance M, and the magnetic effect acting in the external is also decreased. During the process of generating plasma, the plasma density is decreased with a decrease of the electromagnetic energy provided to plasma, and vice versa.

$$G = (\tfrac{1}{2}) L_T I_R^2 = (L-M) I_R^2 \quad (4)$$

If the mutual inductance M is not uniform along the longitudinal direction of the two go-and-return conductors 61 and 62, i.e., if the mutual inductance M is varied (in other words, if it is changed), for each region, the effective inductance and the electromagnetic energy are determined depending on the mutual inductance M of the region.

Figure 6:
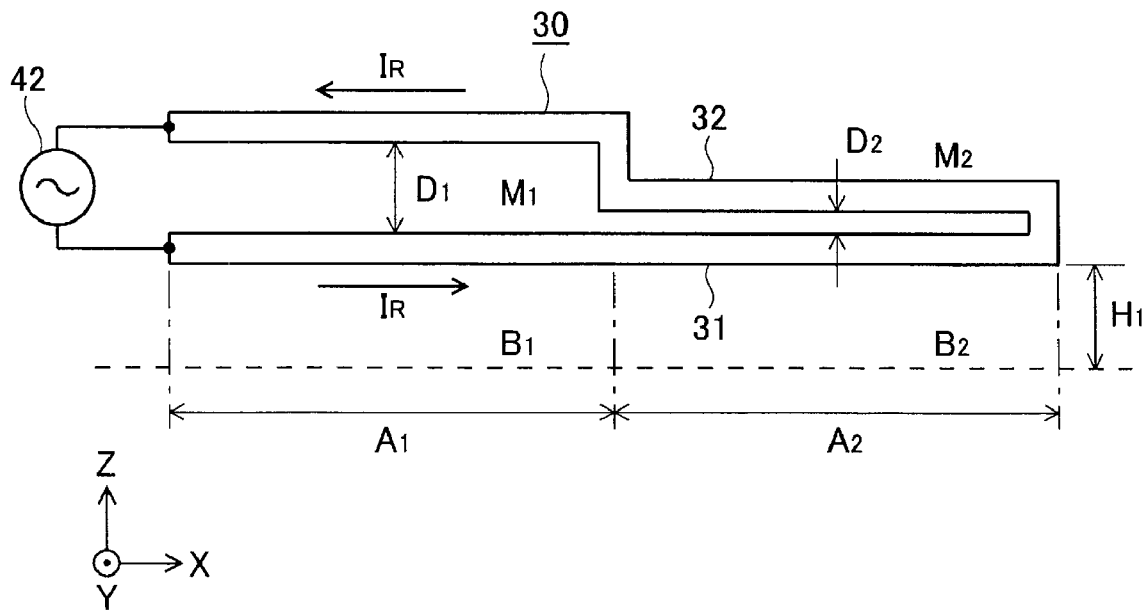
FIG. 6 schematically shows a side view of an antenna in which the interval in the up-down direction of the two go-and-return conductors disposed in the up-down direction can be varied along the longitudinal direction of the antenna according to an embodiment of the present invention.

The antenna 30 of the present invention is designed according to the foregoing mentioned principle. For example, as shown in FIG. 6, the antenna 30 is composed of the two go-and-return conductors 31 and 32 closely disposed to each other in the up-down direction Z. Moreover, regarding the interval D between the two go-and-return conductors 31 and 32 in the up-down direction Z, a two-stage change (a stepwise change) in the longitudinal direction X of the antenna 30 is designed, wherein the mutual inductance $M_1$ of the large interval $D_1$ of the region $A_1$ is greater than the mutual inductance $M_2$ of the small interval $D_2$ of the region $A_2$ (i.e., $M_1 < M_2$). Accordingly, based on Equation 3, the effective inductance of the region $A_1$ may be larger than the effective inductance of the region $A_2$. According to Equation 4, regarding to the magnetic flux density of the space which is apart from the antenna 30 (more particularly the conductor 31) in a distance $H_1$, the magnetic flux density $B_1$ of the region $A_1$ is greater than the magnetic flux density $B_2$ of the region $A_2$ (i.e., $B_1 > B_2$). Therefore, the plasma density of the region $A_1$ is capable of being greater than the plasma density of the region $A_2$.

In addition, though the matching circuit 44 is omitted in FIG. 6 and the follow-up embodiments in order to simplify the descriptions, in general, the matching circuit 44 is disposed between the high frequency power source 42 and the antenna 30, as shown in FIG. 1.

Figure 7:
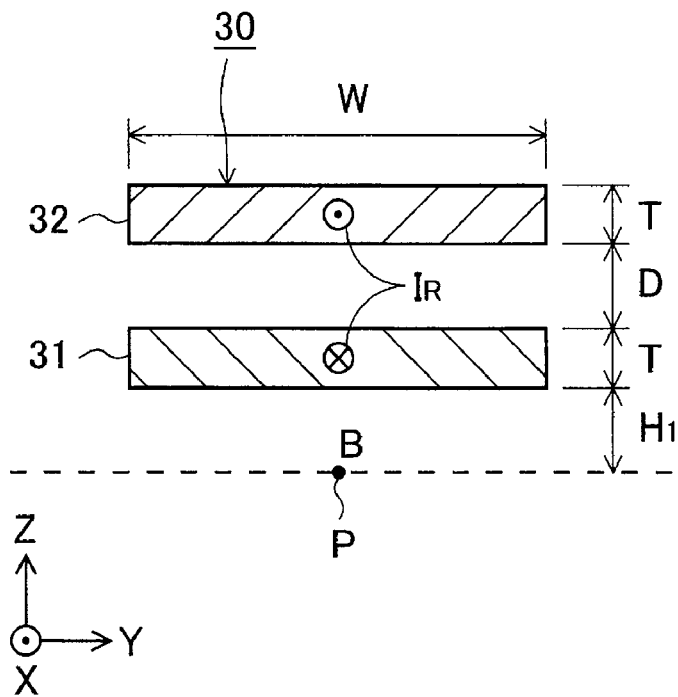
FIG. 7 shows a model illustrating a simulation is performed in which the magnetic flux density near the central bottom of the antenna is varied and the interval in the up-down direction of the plate-shaped two go-and-return conductors disposed in the up-down direction is varied.

The result of a simulation, in which the magnetic flux density near the central bottom of the antenna 30 is varied and the interval D in the up-down direction Z of the plate-shaped two go-and-return conductors 31 and 32 disposed in the up-down direction Z is varied, is described. The model, in which the simulation is used, is shown in FIG. 7. Herein, the thickness T of the two conductors is 3 mm, the width W of the left-right direction Y is 70 mm, the X direction is defined to be sufficiently long, the magnetic flux density B within a space which is apart from the point P in the distance $H_1$ (fixed at mm) located at the central bottom in the left-right direction Y of the conductor 31 and the interval D is varied when a certain high frequency current $I_R$ (peak value is 100 A) is applied.

TABLE 1

| interval D [mm] | magnetic flux density B [× $10^{-4}$ T] | magnetic flux density ratio $B/B_0$ [%] | squared ratio $(B/B_0)^2$ [%] |
| --- | --- | --- | --- |
| 0.5 | 0.540 | 6.82 | 0.47 |
| 1.0 | 0.615 | 7.77 | 0.60 |
| 2.5 | 0.837 | 10.57 | 1.12 |
| 5.0 | 1.194 | 15.07 | 2.27 |
| 7.5 | 1.533 | 19.35 | 3.74 |
| 10 | 1.854 | 23.40 | 5.47 |
| 15 | 2.440 | 30.78 | 9.47 |
| 20 | 2.952 | 37.24 | 13.87 |
| 25 | 3.397 | 42.86 | 18.37 |
| 30 | 3.783 | 47.72 | 22.78 |
| 35 | 4.118 | 51.95 | 26.99 |
| 40 | 4.409 | 55.63 | 30.95 |
| 45 | 4.664 | 58.84 | 34.63 |
| 50 | 4.888 | 61.67 | 38.03 |

The magnetic flux density $B_0$ of Table 1 is the magnetic flux density at the point P of a common antenna just having the conductor 31 and without the conductor 32. Such magnetic flux density $B_0$, the ratio of magnetic flux density $B/B_0$ in the case of two go-and-return conductors 31 and 32 and the square of the ratio thereof $((B/B_0)^2)$ are described in Table 1. It can be noted that regarding the square of the magnetic flux density ratio $(B/B_0)^2$, the eddy current loss is approximately proportional to the square of the magnetic flux density B when the electromagnetic energy is supplied for the plasma. As shown in Table 1, regarding the variation of interval D, a large variation can be made to the magnetic flux density B and the square of the ratio thereof $((B/B_0)^2)$. For example, as the interval D is varied from 1 mm to 50 mm, the square of the magnetic flux density ratio $((B/B_0)^2)$ can be changed to become 60 times thereof.

Figure 8:
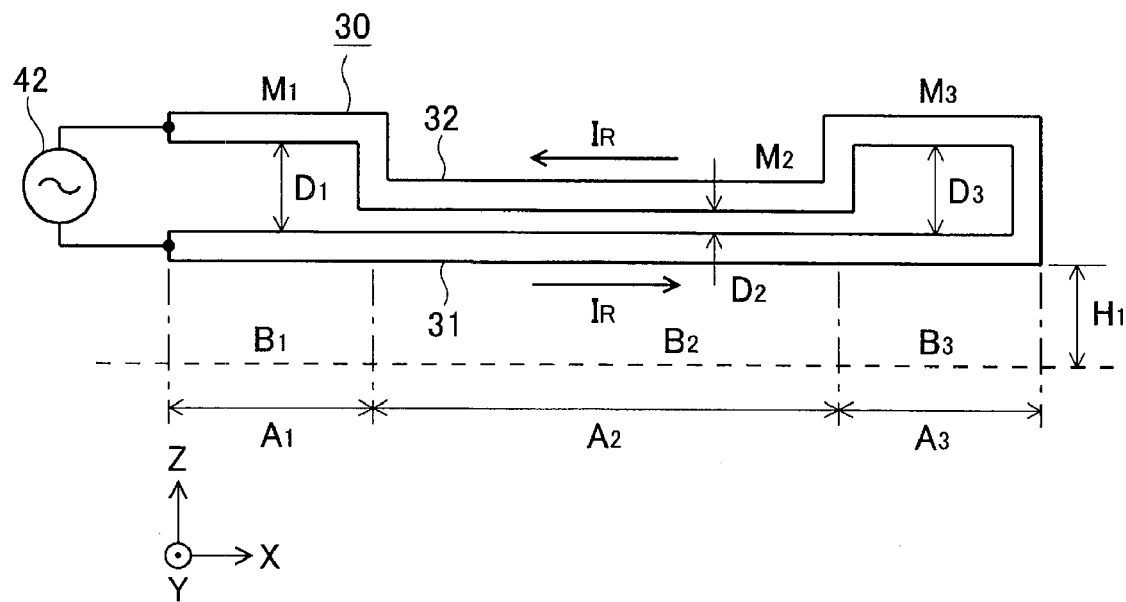
FIG. 8 schematically shows a side view of an antenna in which the interval in the up-down direction of the two go-and-return conductors disposed in the up-down direction is varied along the longitudinal direction of the antenna according to another embodiment of the present invention.

In FIG. 8, the interval D is in the up-down direction Z of the two go-and-return conductors 31 and 32 closely disposed to each other in the up-down direction Z. As an example, the interval D is D2 at the region $A_2$ of the central part in the longitudinal direction X of the antenna 30 and is stepwisely larger to become D1 and D3 ($D_1 = D_3$ in this embodiment) at the two terminal regions A1 and A3. In that case, $M_1=M_3<M_2$ is represented in the mutual inductances $M_1$, $M_2$ and $M_3$ of each of the regions $A_1$, $A_2$ and $A_3$, the effective inductance $M_2$ of the region $A_2$ is greater than the regions $A_1$ and $A_3$. $B_1=B_3>B_2$ is represented regarding the magnetic flux density $B_1$, $B_2$ and $B_3$. As a result, the electromagnetic energy supplied for the plasma from the antenna 30 in the regions $A_1$ and $A_3$ can be relatively increased to be greater than the electromagnetic energy in the region $A_2$.

The antenna 30 illustrated in FIG. 1 and FIG. 2A to 2C is similar to the antenna 30 illustrated in FIG. 8, a more specifically illustrated embodiment. As the detailed descriptions of the antenna 30 of FIG. 1 and FIG. 2A to 2C, the antenna 30 includes two go-and-return conductors 31 and 32 closely disposed to each other with an interval D in the up-down direction Z. The two conductors 31 and 32 are a plate shape, and are rectangular as mentioned above. The underside of the conductor 31 at the lower side (side of plasma 50) is located in a vacuum within the vacuum container 4 and the conductor 32 at the upper side is located in an ambient atmosphere. One of the terminals of the conductor 31 and one of the terminals of the conductor 32 are electrically opened, and an insulating material 36 is disposed therebetween in this embodiment. The other terminal of the conductor 31 and the other terminal of the conductor 32 are electrically connected at a connecting portion 33. The high frequency power is supplied to the interval between the terminals of conductors 31 and 32 from the high frequency power source 42 through the matching circuit 44.

Figure 2C:
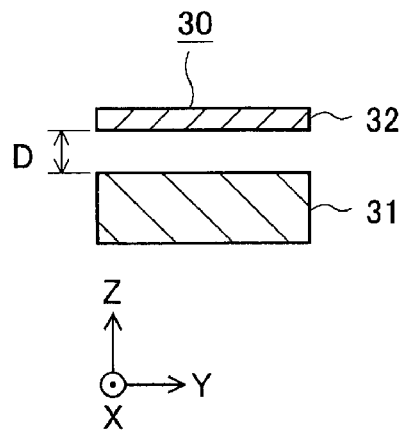
FIG. 2C is a cross-sectional view along Line C-C of the antenna of FIG. 1.
Figure 3:
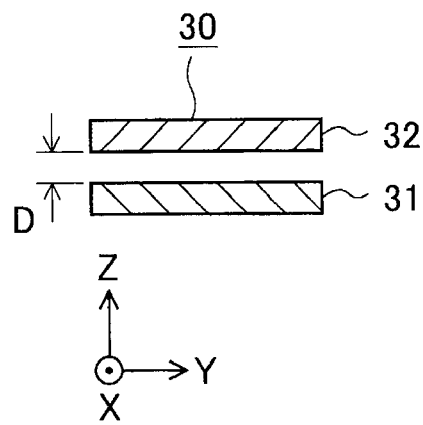
FIG. 3 is a cross-sectional view of plate-shaped go-and-return conductors disposed in the up-down direction according to another embodiment of the present invention.

The two conductors 31 and 32 are a plate shape in this embodiment (more particularly the conductor 31 is a plate shape, and the conductor 32 is a bended plate shape). For example, the conductor 31 at the lower side can be designed to have a larger thickness as shown in FIG. 1 and FIG. 2C, and the two conductors 31 and 32 can be designed to have the same thickness as shown in FIG. 3.

Since the conductor 32 at the upper side is bended in a stepwise manner, the intervals $D_1$ and $D_3$ ($D_1=D_3$ in this embodiment) of the regions of the two terminals are larger than the interval D2 of the region $A_2$ of the central portion in the longitudinal direction X of the antenna 30. Accordingly, the mutual inductances M of the region of two terminals are known to be smaller than the mutual inductance M of the central portion in the longitudinal direction X of the antenna 30, i.e., $M_1=M_3<M_2$ in this embodiment. And similar to FIG. 8, the electromagnetic energy supplied for the plasma 50 from the antenna 30 at the region of the two terminals can be relatively increased to be greater than the electromagnetic energy in the central portion in the longitudinal direction X of the antenna 30.

The interval D and the mutual inductance M of the antenna 30 can be varied in a stepwise manner along the longitudinal direction X of the antenna 30 as shown in FIG. 1 and FIG. 8, or they can also be varied continuously. The manner of variation of the interval D and the mutual inductance M of the antenna 30 is similar in the following embodiments. Even if the interval D is varied in a stepwise manner, since the plasma has a diffusion effect, the plasma density can be smoothly varied. For example, the interval D and the mutual inductance M of the antenna 30 can be continuously varied in the longitudinal direction X of the antenna 30 by disposing a gently-sloping valley recessed at the central portion of the conductor 32 of FIG. 1 and FIG. 2A to 2C at the upper side.

Instead of antenna 30 of FIG. 1, FIG. 2A to 2C and FIG. 8, the antenna 30 can also be designed in manner similar to that of the antenna 30 as shown in FIG. 6. Moreover, the antenna 30 can also be designed in a manner the same as that of the antenna 30 shown in FIG. 9.

Figure 9:
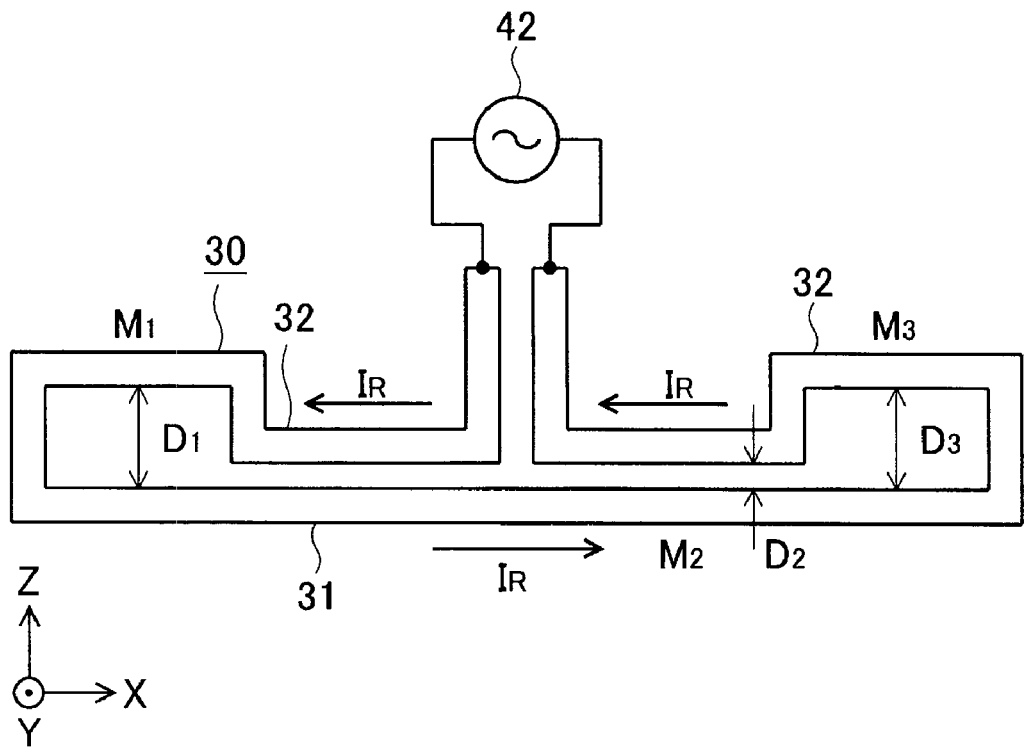
FIG. 9 schematically shows a side view of an antenna in which the interval in the up-down direction of the two go-and-return conductors disposed in the up-down direction is varied along the longitudinal direction of the antenna according to another embodiment of the present invention.

FIG. 9 illustrates a different antenna 30 from FIG. 1 and FIG. 8. Namely, instead of supplying the high frequency power from the terminals (terminal power supply) of the antenna 30 as shown in FIG. 1 and FIG. 8, the high frequency power can be supplied from the central portion (center power supply) of the antenna. Similarly, the center power supply can be applied in the antenna 30 in other embodiments.

Figure 10:
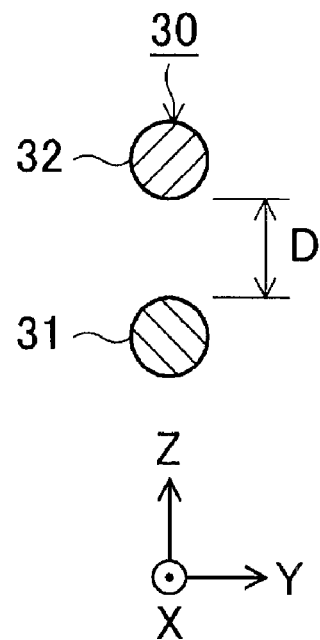
FIG. 10 is a cross-sectional view of two rod-shaped go-and-return conductors disposed in the up-down direction according to an embodiment of the present invention.
Figure 11:
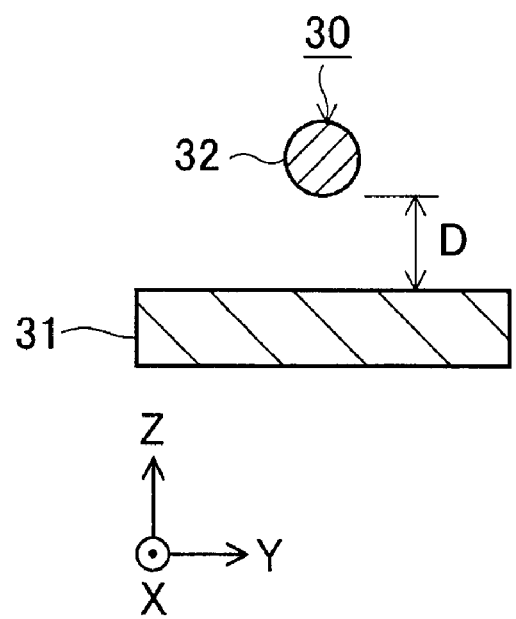
FIG. 11 is a cross-sectional view of two rod-shaped go-and-return conductors in which one conductor is plate-shaped and the other conductor is rod-shaped according to one embodiment of the present invention.
Figure 12:
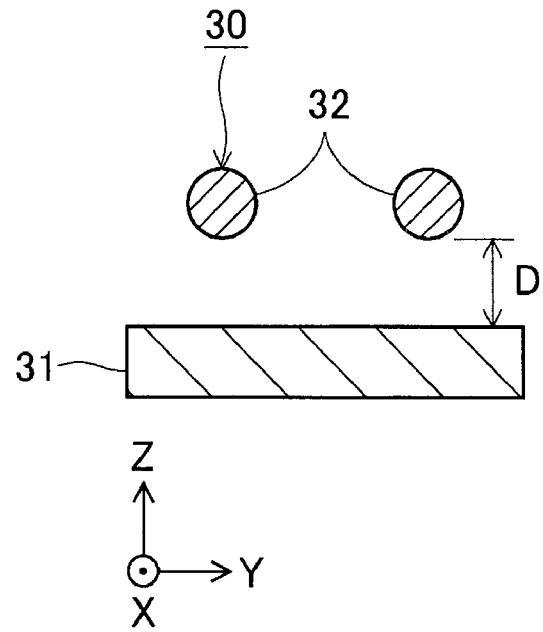
FIG. 12 is a cross-sectional view of two rod-shaped go-and-return conductors in which one conductor is plate-shaped and the other conductor is rod-shaped according to another embodiment of the present invention.

For example, the go-and-return conductors 31 and 32 which form the antenna 30 can be a plate shape as described in the aforementioned embodiments, a rod shape as shown in FIG. 10 and a combination of rod and plate shape. For example, as shown in FIG. 11, the conductor 31 at the lower side is a plate shape and the conductor 32 at the upper side is a rod shape. In that case, as shown in FIG. 12, the conductors 32 at the upper side can also be electrically disposed in parallel (two conductors 32 are shown in FIG. 12). In the embodiment, the go-and-return conductors 31 and 32 are electrically connected to each other at the connecting portion (please refer to the connecting portion 33 of FIG. 1) in the longitudinal direction X.

The shape of the cross-section of each conductor 31 and 32 is not limited in the present invention, and they can be circular, elliptical, tetragonal or the like. In addition, each of the conductors 31 and 32 can be hollowed so that a coolant or cooling water can flow there-through for cooling the conductors 31 and 32.

In the plasma processing apparatus of the embodiment of the present invention, the antenna 30 is composed of two go-and-return conductors 31 and 32 closely disposed to each other in the up-down direction Z in which a high frequency current $I_R$ flows in opposite directions. Thus, referring to Equation 3, the effective inductance decreases due to the mutual inductance between the go-and-return conductors 31 and 32. Since almost the whole impedance of the antenna 30 is inductance in the high frequency region, the potential difference generated in the antenna 30 can be suppressed to be small because of the decrease of the effective inductance. Thus, the potential of the antenna 30 can be suppressed to be small and the potential of the plasma 50 can also be suppressed to be small.

As a result, the energy of the charged particles (e.g., ions) impinging to the substrate 2 from the plasma 50 can be suppressed to be small. Accordingly, for example, when a film is formed on the substrate 2 by using the plasma 50, the damage formed on the film can be suppressed to the minimum and the film quality can also be improved. Moreover, even if the antenna 30 is increased in length, according to the above mentioned reason, since the potential of the antenna 30 can be suppressed to be small and the potential of the plasma 50 can also be suppressed to be small, it is easy to correspondingly increase the size of the substrate 2 with the increased length of the antenna 30.

Furthermore, since the mutual inductance M between the go-and-return conductors 31 and 32 can be varied along the longitudinal direction X of the antenna 30 according to the interval D of the go-and-return conductors in the up-down direction Z being changed along the longitudinal direction X of the antenna 30, the electromagnetic energy supplied for the plasma 50 from the antenna 30 can be varied along the longitudinal direction X of the antenna 30. Accordingly, the plasma density distributed along the longitudinal direction X of the antenna 30 can be controlled. As a result, the processing status of the substrate 2 in the longitudinal direction X of the antenna 30 can be controlled. For example, when a film is formed on the substrate 2 by using the plasma 50, the film thickness distributed along the longitudinal direction X of the antenna 30 can be controlled.

In addition, since the antenna 30 is composed of two go-and-return conductors 31 and 32 closely disposed to each other in the up-down direction Z in which a high frequency current $I_R$ flows in opposite directions and the interval D in the up-down direction Z of the go-and-return conductors 31 and 32 can be varied along the longitudinal direction X of the antenna 30, compared to the condition of the interval in the left-right direction Y between the go-and-return conductors closely disposed to each other in the left-right direction being capable to be varied, the magnetic flux density near the bottom of the antenna 30 can be well controlled according to the variation of the interval D of the go-and-return conductors 31 and 32. Accordingly, the electromagnetic energy supplied for the plasma 50 from the antenna 30 can be well controlled because of the interval D of the go-and-return conductors 31 and 32 can be varied. Consequently, the plasma density distribution can be well controlled, and the simulation result is described as follow.

In the simulation, the variation of the magnetic flux density B, at the point P (referring to FIG. 7, FIG. 13 to FIG. 15) located at the central region below, in the left-right direction Y of the antenna 30 is calculated, when the interval D of the go-and-return conductors 31 and 32 of the antenna 30 is varied.

Figure 16:
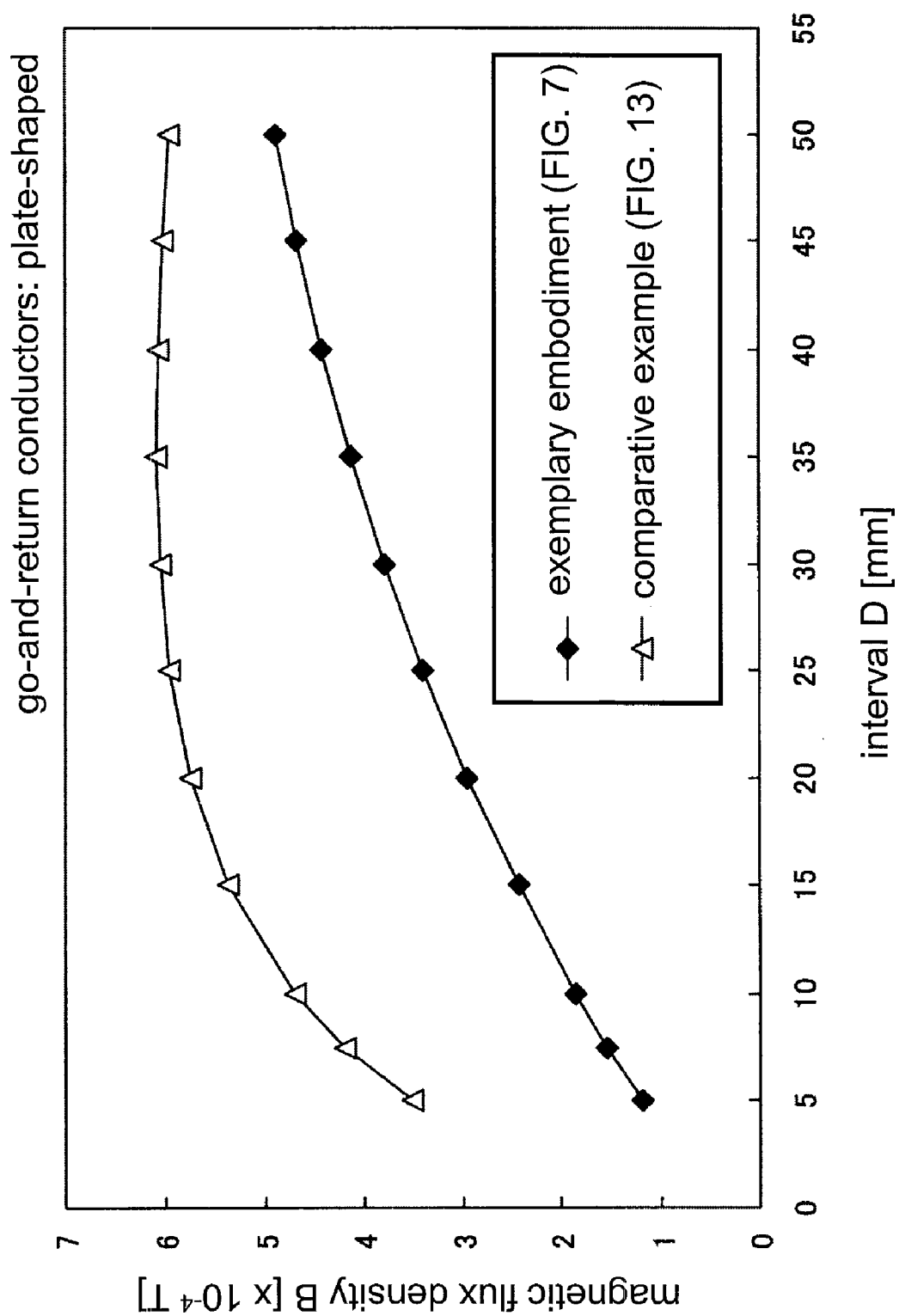
FIG. 16 is a graph illustrating the variation of the magnetic flux density via the variation of the intervals respectively shown in the model of FIG. 7 (exemplary embodiment) and in the model of FIG. 13 (comparative example).

Firstly, as an exemplary embodiment of the present invention as shown in FIG. 7, in the condition of the plate-shaped go-and-return conductors 31 and 32 of the antenna 30 being closely disposed to each other in the up-down direction Z, the calculated variation values of the magnetic flux density B at the point P when the interval D in the up-down direction Z between the go-and-return conductors 31 and 32 is varied are shown in FIG. 16. The calculation condition is the same as that described in FIG. 7, and thus the magnetic flux density B is the same as that in Table 1.

Figure 13:
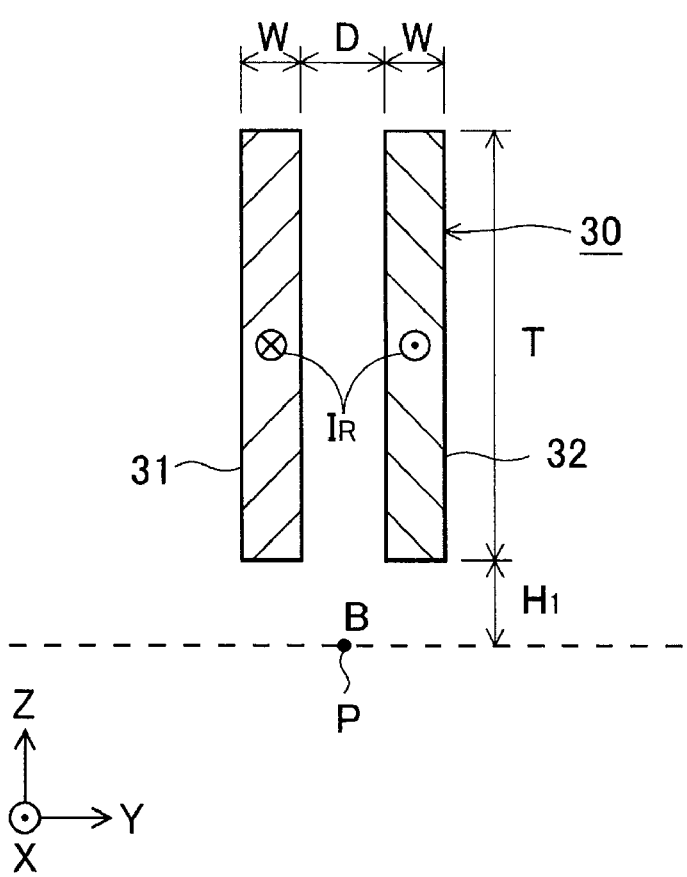
FIG. 13 shows a model illustrating a simulation is performed in which the magnetic flux density near the central bottom of the antenna is varied and the interval in the left-right direction of the plate-shaped two go-and-return conductors disposed in the left-right direction is varied.

Moreover, in a comparative example as shown in FIG. 13, under the condition of the plate-shaped go-and-return conductors 31 and 32 of the antenna 30 being closely disposed to each other in the left-right direction Y, the calculated variation values of the magnetic flux density B at the point P when the interval D in the left-right direction Y between the go-and-return conductors 31 and 32 is varied are shown in FIG. 16. The calculation condition is as follow: the thickness T of the two conductors 31 and 32 is 70 mm, the width W in the left-right direction Y is 3 mm, and the values of the distance $H_1$, the high frequency current $I_R$ and so on are the same as those described in FIG. 7.

According to FIG. 16, in the comparative example, when the interval D is varied, the variation of the magnetic flux density B becomes saturated very soon (i.e., the magnetic flux density B does not varies so much with the variation of the interval D). On the contrary, in the exemplary embodiment, when the interval D is varied, the magnetic flux density B is proportionally and mildly varied and the variation range is large. Accordingly, compared to the comparative example, the control of the magnetic flux density B in the exemplary embodiment is better. Namely, according to the variation of the interval D, the electromagnetic energy supplied for the plasma 50 from the antenna 30 can be controlled by controlling the magnetic flux density B, and consequently the control of the plasma density distribution can become easier.

Figure 14:
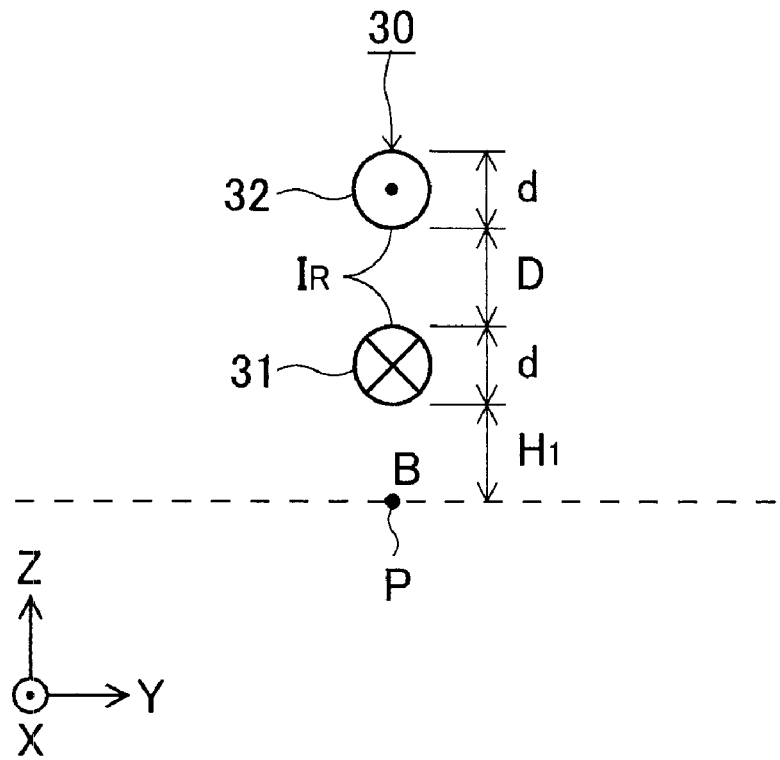
FIG. 14 shows a model illustrating a simulation is performed in which the magnetic flux density near the central bottom of the antenna is varied and the interval in the up-down direction of the rod-shaped two go-and-return conductors disposed in the up-down direction is varied.
Figure 17:
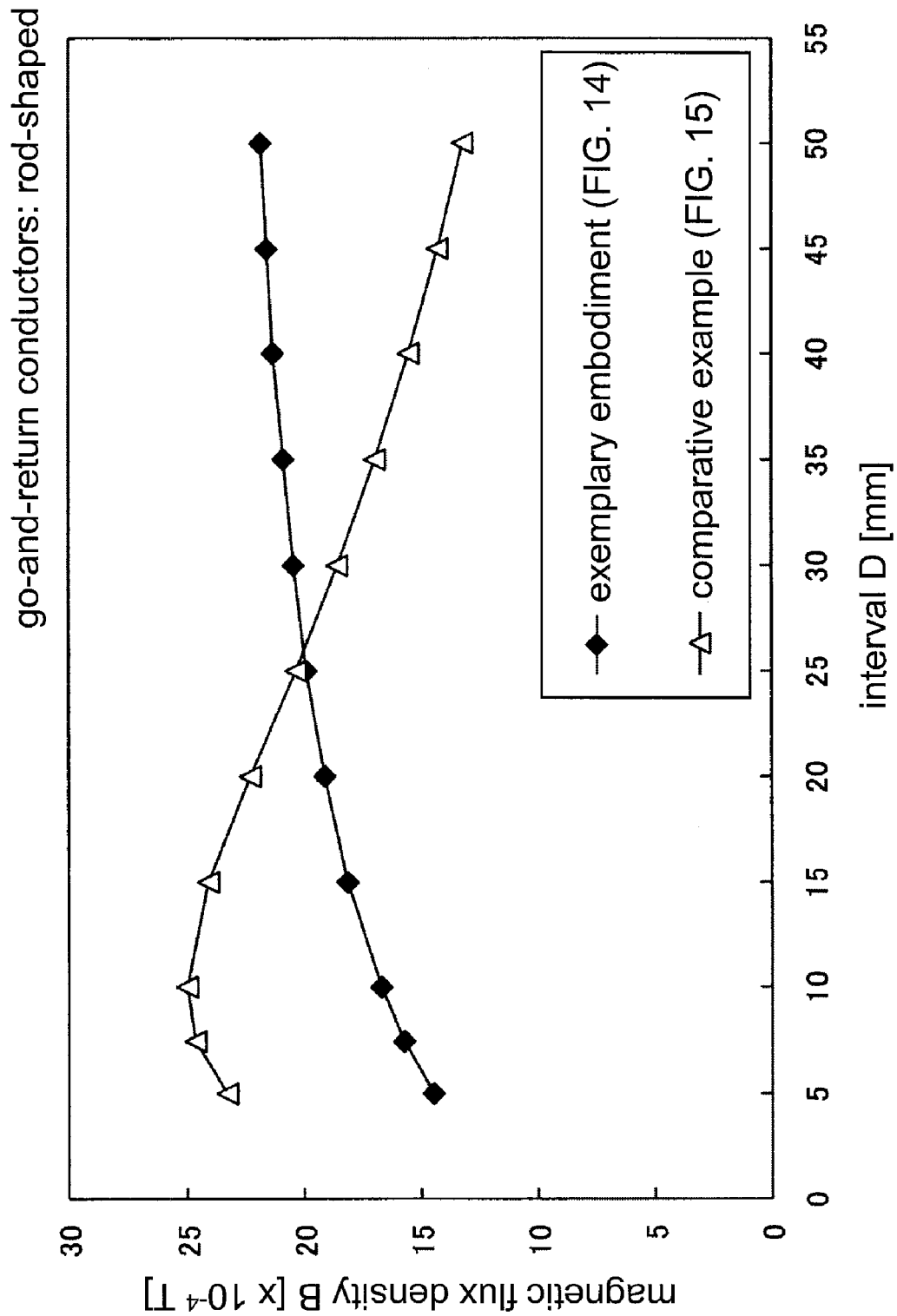
FIG. 17 is a graph illustrating the variation of the magnetic flux density via the variation of the intervals respectively shown in the model of FIG. 14 (exemplary embodiment) and in the model of FIG. 15 (comparative example).

Then, as an exemplary embodiment of the present invention, as shown in FIG. 14, in the condition of the rod-shaped go-and-return conductors 31 and 32 of the antenna 30 being closely disposed to each other in the up-down direction Z, the variation values of the magnetic flux density B at the point P calculated when the interval D in the up-down direction Z between the go-and-return conductors 31 and 32 is varied are shown in FIG. 17. The calculation condition is as follow: the diameter d of the two conductors 31 and 32 is 6 mm, and the values of the distance $H_1$, the high frequency current $I_R$ and so on are the same as those described in FIG. 7.

Figure 15:
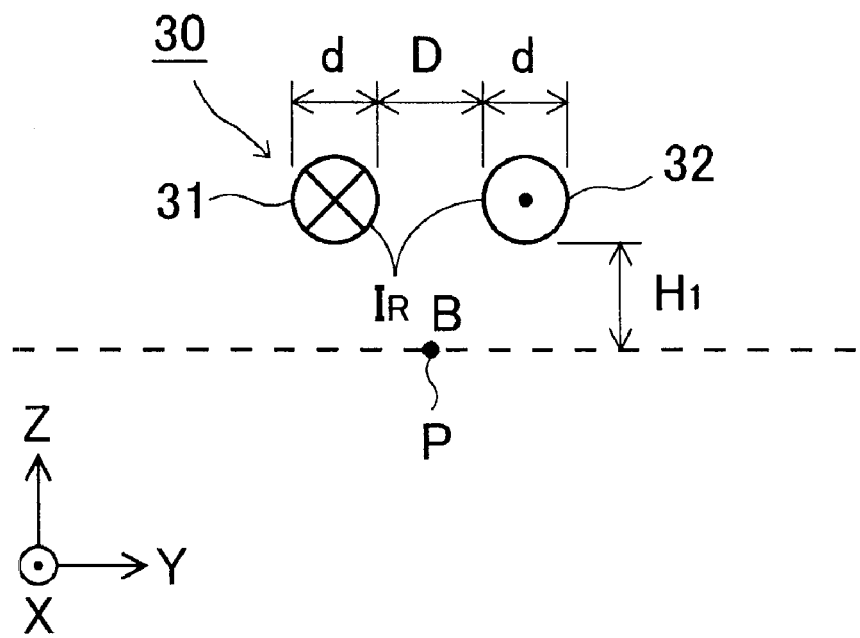
FIG. 15 shows a model illustrating a simulation is performed in which the magnetic flux density near the central bottom of the antenna is varied and the interval in the left-right direction of the rod-shaped two go-and-return conductors disposed in the left-right direction is varied.

Moreover, in a comparative example as shown in FIG. 15, under the condition of the rod-shaped go-and-return conductors 31 and 32 of the antenna 30 being closely disposed to each other in the left-right direction Y, the calculated variation values of the magnetic flux density B at the point P, when the interval D in the left-right direction Y between the go-and-return conductors 31 and 32 is varied, are shown in FIG. 17 as a comparative example. The calculation condition is the same as the detailed description of FIG. 14, except for the change of the two conductors 31 and 32.

According to FIG. 17, in the comparative example, when the interval D is varied, the variation of the magnetic flux density B is complex as the variation goes up and down subsequently. On the contrary, in the exemplary embodiment, when the interval D is varied, the magnetic flux density B is proportionally and mildly varied. Accordingly, compared to the comparative example, the control of the magnetic flux density B in the exemplary embodiment is better. Namely, according to the variation of the interval D, the electromagnetic energy supplied for the plasma 50 from the antenna 30 can be controlled by controlling the magnetic flux density B, and consequently the control of the plasma density distribution can become easier.

Figure 20A:
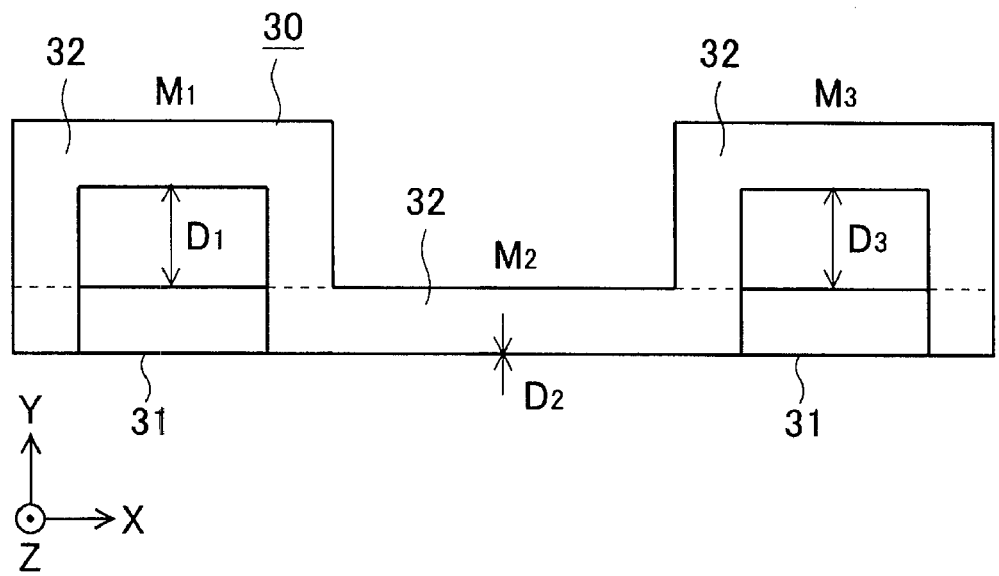
FIG. 20A is a plan view of an antenna in which the interval in the left-right direction of the two go-and-return conductors disposed in the up-down direction is varied along the longitudinal direction of the antenna according to an embodiment of the present invention.
Figure 20B:
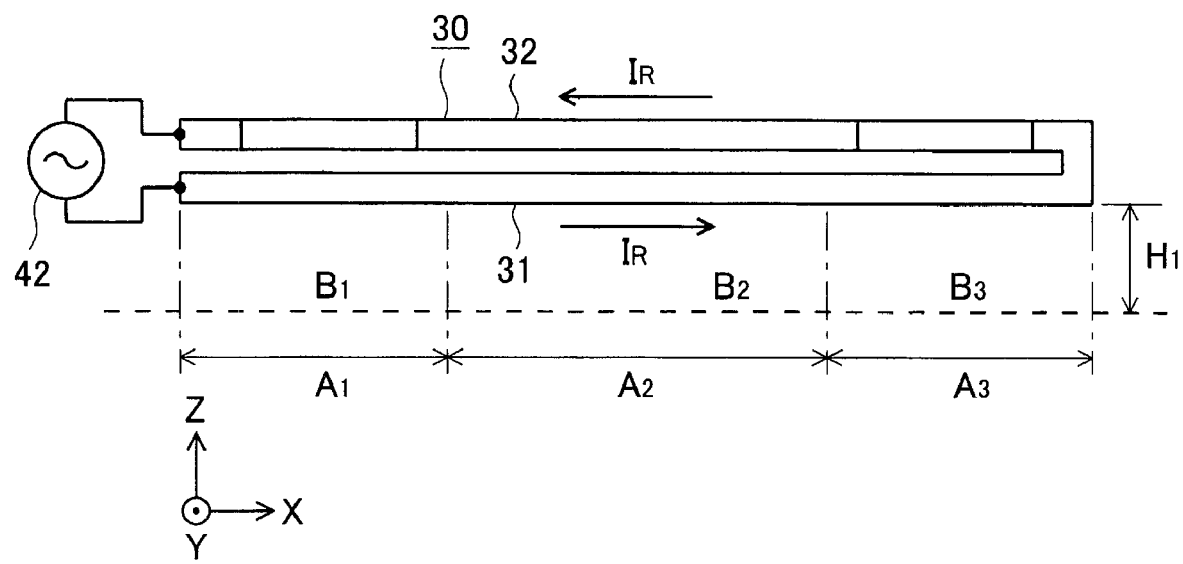
FIG. 20B is a side view of an antenna in which the interval in the left-right direction of the two go-and-return conductors disposed in the up-down direction is varied along the longitudinal direction of the antenna according to an embodiment of the present invention.

Additionally, as shown in FIG. 20A and FIG. 20B, it is also possible that the go-and-return conductors 31 and 32 of the antenna 30 can be closely disposed to each other in the up-down direction Z, and the mutual inductance between the go-and-return conductors 31 and 32 can be varied along the longitudinal direction X of the antenna 30 as the interval D located in the left-right direction Y and between the go-and-return conductors 31 and 32 is varied along the longitudinal direction X of the antenna 30.

As shown in FIG. 20, the intervals $D_1$ and $D_3$ ($D_1=D_3$ in this embodiment) of the regions $A_1$ and $A_3$ of the two terminals are larger than the interval D2 of the region $A_2$ of the central portion in the longitudinal direction X of the antenna 30. Similar to the condition shown in FIG. 8, the effective inductances of the regions $A_1$ and $A_3$ of the two terminals are larger than the effective inductance of the regions $A_2$, wherein for the mutual inductances $M_1$, $M_3$ and $M_2$ of each of the regions $A_1$, $A_2$ and $A_3$, $M_1=M_3<M_2$, and for the magnetic flux density $B_1$, $B_2$ and $B_3$, $B_1=B_3>B_2$, in this embodiment. As a result, the electromagnetic energy supplied for the plasma 50 from the antenna 30 at the regions $A_1$ and $A_3$ of the two terminals can be relatively increased to be greater than the electromagnetic energy in the central portion of the region $A_2$.

As shown in FIG. 20A and FIG. 20B, since the control of magnetic flux density B according to the interval D can be considered to be approximate to the comparative examples shown in FIG. 13 and FIG. 15, the above mentioned embodiment is more preferable.

Figure 4:
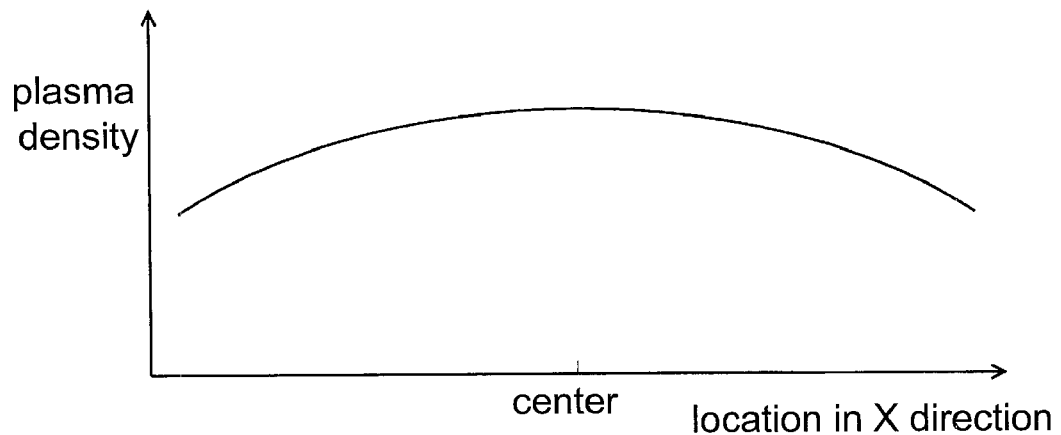
FIG. 4 roughly illustrates the plasma density distributed along the longitudinal direction of a case in which a common and simple planar antenna is used.

By the way, in general, when a common planar antenna is being used, the plasma density distribution thereof in the longitudinal direction is shown as FIG. 4, the plasma density distributed at the two terminals is smaller than the plasma density distributed at the central portion, i.e., a mountain-shaped distribution. It can be simply explained that the plasma is diffused from two sides at the central portion whereas the plasma is diffused from single side at each of the two terminals.

Relatively according to FIG. 1, FIG. 2A to 2C and FIG. 8, the mutual inductance in the longitudinal direction X of the antenna 30 at the two terminals can be reduced to be smaller than the mutual inductance at the central portion by means of increasing the interval D between the go-and-return conductors 31 and 32 located in the up-down direction Z in the longitudinal direction X of the antenna 30 at the two terminals to be larger than the interval at the central portion. Therefore, the effective inductance at the two terminals of the antenna 30 is relatively greater than that at the central portion. As a result, contrary to the mountain-shaped, the electromagnetic energy supplied for plasma 50 from the antenna 30 in the longitudinal direction X of the antenna 30 at the two terminals is relatively greater than the electromagnetic energy at the central portion. And thus, the plasma 50 is more strongly generated at the two terminals than it is generated at the central portion. Accordingly, the mountain-shaped plasma density distribution is compensated, and the plasma density distribution can be homogeneously enhanced in the longitudinal direction X of the antenna 30. For example, when a film is formed on the substrate 2 by using the plasma 50, homogeneity of the film thickness in the longitudinal direction X of the antenna 30 can be improved.

Moreover, as shown in the embodiment of FIG. 1, a shielding plate 46 for shielding the inner side surface of the vacuum container 4 against the plasma 50 can also be disposed in the plasma processing apparatus. The shielding plate 46 is made with an insulating material. The shielding plate 46 can be directly mounted near the inlet of the opening 7 of the ceiling 6 of the vacuum container 4, and it can also be mounted by using a frame-shaped supporting plate 48 as shown in this embodiment. The shielding plate 46 can also be used in the antenna 30 of other embodiments.

The material of the shielding plate 46 can be quartz, aluminum, silicon carbide, silicon and the like. In order to avoid the problem of releasing oxygen out of the shielding plate 46 due to the deoxidization in hydrogen-based plasma, it is preferred to use the non-oxide materials such as silicon, silicon carbide and the like. For example, it is simple to use a silicon plate.

Through the disposition of the shielding plate 46, adverse conditions, such as metal contamination of the surface of the substrate 2 and the plasma 50 due to the charged particles (mainly ions) of the plasma 50 sputtering on the antenna 30 surface can be prevented.

Even if the shielding plate 46 is disposed, the shielding plate 46 cannot prevent the potential of the antenna 30 to reach the plasma 50 because the shielding plate is made of an insulating material. Therefore, the potential of the antenna 30 can be suppressed effectively by reducing the effective inductance of the antenna 30 as in the above mentioned manner.

Figure 18:
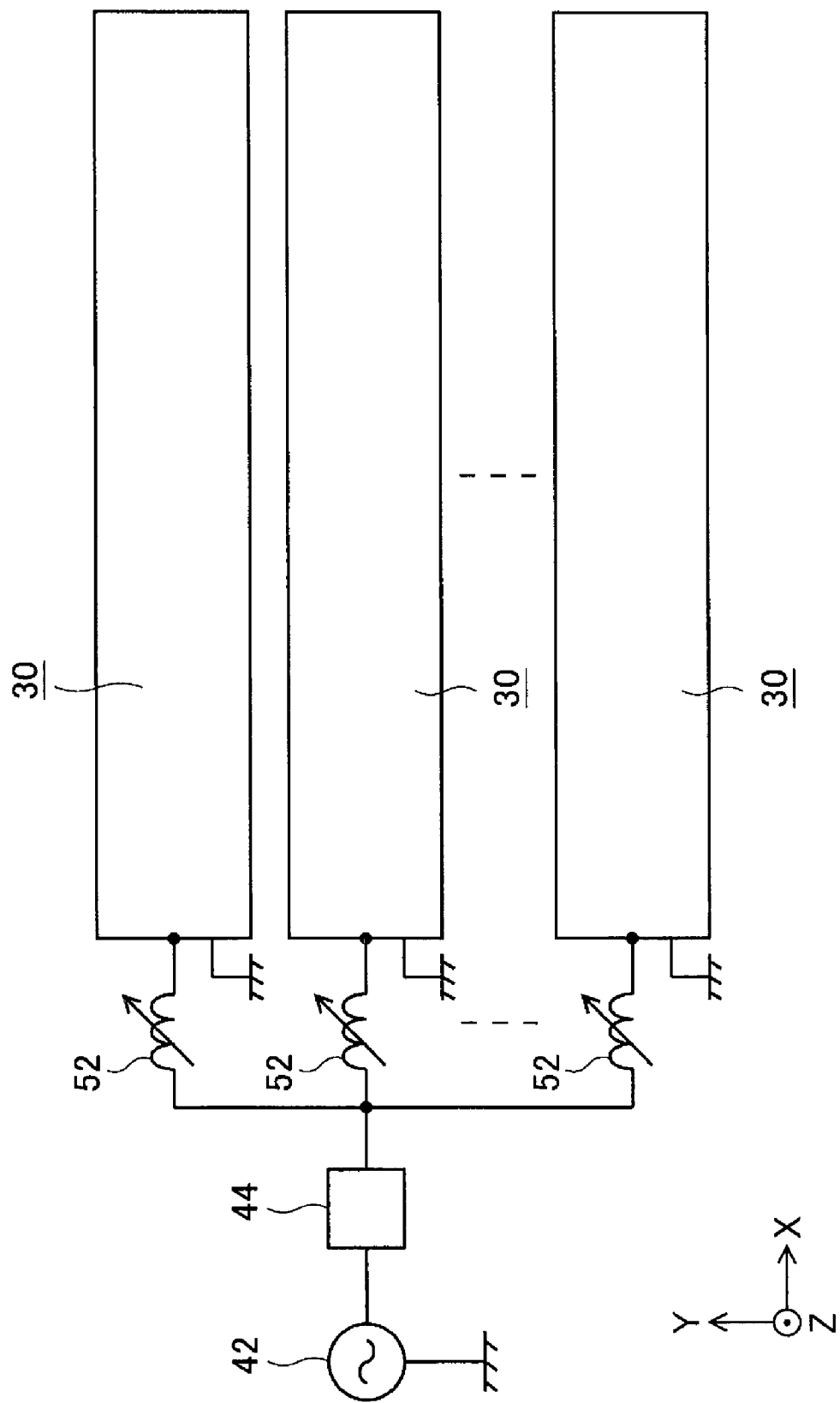
FIG. 18 is a plan view showing that a plurality of antennas are disposed in parallel according to an embodiment of the present invention.

As shown in FIG. 18, a plurality of antennas 30 can be disposed in parallel in the Y direction, and the high frequency power can be supplied simultaneously to the antennas 30 from a common high frequency power source 42 through the variable impedances 52 respectively connected to the antennas 30 in series.

Each of the antennas 30 can be designed as one of the antennas shown in FIG. 1, FIG. 2A to 2C, FIG. 6, FIG. 8 and FIG. 9.

The variable impedance 52 can be the variable inductance shown in FIG. 18, the variable condenser (variable capacitance), or a combination thereof. Since the impedance of the feed circuit can be increased by inserting the variable inductance, the current of the antenna 30, at which the high frequency current becomes overflown, can be suppressed. The impedance of the feed circuit can be decreased and the capacitive reactance can be increased when the inductive reactance is large by inserting the variable condenser. Accordingly, the current of the antenna 30, at which the high frequency current becomes difficult to flow, can also be increased.

In the condition of FIG. 18, since the plurality of antennas 30 are disposed in parallel and the high frequency power is simultaneously supplied thereto, plasma with a larger area can be generated. Moreover, through the aforementioned action, not only the potential of each of the antennas 30 can be suppressed to be small, the plasma density distributed along the longitudinal direction X of each of the antennas 30 can also be controlled. Furthermore, the balance of the high frequency current flowing to the plurality of antennas 30 can be adjusted through the variable impedances 52 respectively connected to the antennas 30. Therefore, the plasma density distributed in parallel direction, Y direction of the antennas 30 can be controlled. As a result, the plasma potential can be suppressed to be small and plasma is generated with good homogeneity and a large area.

Figure 19:
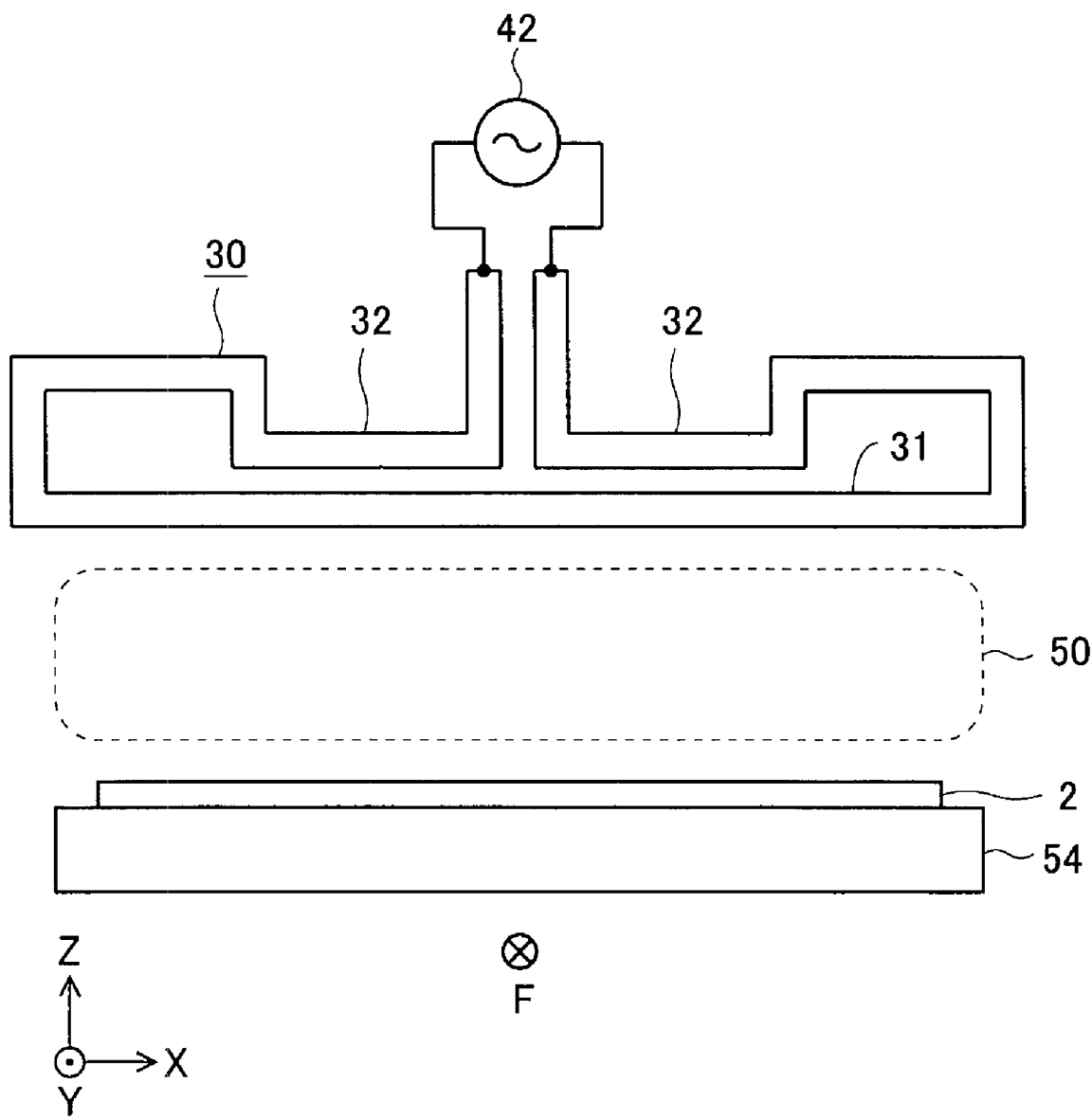
FIG. 19 is a side view of a plasma processing apparatus according to another embodiment of the present invention.

In any of the aforementioned embodiments, the to be treated substrate 2 is immovably fixed in the vacuum container 4. However, as shown in FIG. 19, the substrate 2 can also be disposed in the vacuum container 4 (omitted in FIG. 19), in which the substrate 2 can be moved in a direction as shown with an arrow F (and its opposite direction) intersecting (e.g., orthogonal) with the longitudinal direction X of the antenna 30 by using a substrate carrying device 54, i.e., the substrate 2 can be processed as it is moving along the Y direction. Accordingly, the homogeneity of the plasma 50 in the X direction can be enhanced due to the antenna 30. And since the homogeneity of the plasma 50 in the Y direction is not a big problem resulted from the transferring of the substrate, it is also possible that substrate 2 with a large area is processed and good film uniformity is resulted. Furthermore, continuously processing a plurality of substrates 2 is also possible. In this condition, the antenna 30 can be one of the antennas shown in FIG. 1, FIG. 2A to 2C, FIG. 6, FIG. 8 and FIG. 9. In addition, the idea of the substrate 2 being carried can also be used and combined with the idea of having a plurality of antennas 30 disposed in parallel shown in FIG. 18.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A plasma processing apparatus, which is an inductively-coupled-plasma processing apparatus, comprising:
   a first antenna, substantially straight in a plan view of the first antenna, wherein a plasma is generated for performing a plasma treatment to a substrate when a high frequency current is applied to the first antenna to form an electric field in a vacuum container, and the first antenna comprises:
      two go-and-return conductors closely disposed to each other in an up-down direction, wherein the up-down direction is perpendicular to a surface of the substrate, and the high frequency current is applied to flow in opposite directions between the two go-and-return conductors, and
      wherein an interval defined by a distance between the two go-and-return conductors in the up-down direction varies in a longitudinal direction of the first antenna.

2. The plasma processing apparatus as claimed in claim 1, wherein the interval varies in the longitudinal direction of the first antenna to form a plurality of first intervals located at two terminals of the first antenna in the longitudinal direction and a second interval located at a central portion of the first antenna, the first intervals are larger than the second interval.

3. The plasma processing apparatus as claimed in claim 1, further comprising:
   a second antenna disposed in parallel to the first antenna, wherein a high frequency power is simultaneously supplied to each of the first antenna and the second antenna by using a common high frequency power source through a plurality of impedances respectively connected in series to the first antenna and the second antenna.

4. The plasma processing apparatus as claimed in claim 2, further comprising: a second antenna disposed in parallel to the first antenna, wherein a high frequency power is simultaneously supplied to each of the first antenna and the second antenna by using a common high frequency power source through a plurality of impedances respectively connected in series to the first antenna and the second antenna.

* * * * *